United States Patent [19]

Brokaw

[11] Patent Number: 5,119,094
[45] Date of Patent: Jun. 2, 1992

[54] TERMINATION CIRCUIT FOR AN R-2R, LADDER THAT COMPENSATES FOR THE TEMPERATURE DRIFT CAUSED BY DIFFERENT CURRENT DENSITIES ALONG THE LADDER, USING ONE TYPE OF BIOPOLAR TRANSISTOR

[75] Inventor: A. Paul Brokaw, Burlington, Mass.
[73] Assignee: Analog Devices, Inc., Norwood, Mass.
[21] Appl. No.: 439,821
[22] Filed: Nov. 20, 1989
[51] Int. Cl.$^5$ .............................. H03M 1/78
[52] U.S. Cl. .................... 341/154; 341/119; 341/127
[58] Field of Search ............. 341/118, 119, 153, 154, 341/127, 135; 323/313

[56] References Cited

U.S. PATENT DOCUMENTS

| | | | |
|---|---|---|---|
| 3,893,018 | 7/1975 | Marley | 323/313 |
| 3,940,760 | 2/1976 | Brokaw | 341/119 |
| 4,176,344 | 11/1979 | Saari et al. | 341/119 |
| 4,349,811 | 9/1982 | Brokaw | 341/119 |
| 4,591,780 | 5/1986 | Yamada et al. | 323/313 |
| 4,882,533 | 11/1989 | Kelley | 323/313 |
| 4,899,152 | 2/1990 | Barrow et al. | 341/119 X |

OTHER PUBLICATIONS

The Engineering Staff of Analog Devices *Analog-Digital Conversion Handbook* (3rd ed.) pp. 277-294 Prentice-Hall, Eaglewood Cliffs, N.J. © 1986 by Analog Devices Inc.

Primary Examiner—Benjamin R. Fuller
Assistant Examiner—Randy W. Gibson
Attorney, Agent, or Firm—Wolf, Greenfield & Sacks

[57] ABSTRACT

A termination circuit for an R-2R ladder network for producing weighted currents, the 2R terminating resistor of the ladder being connected to an excitation source voltage which is $2(kT/q)\ln 2$ closer to the supply voltage than the emitter of the current source in the last (i.e., least significant) leg of the ladder. The excitation source is fabricated with just one type of bipolar transistor and does not require an amplifier or frequency compensation capacitor(s). The excitation source is a simple circuit requiring only five transistors, at least one of which has an emitter area which is a multiple of the emitter areas of the current source transistors. The base-emitter voltages of the transistors in the excitation source are connected in a voltage loop that goes from a voltage $V_{LSB}$ at the emitter of the current source transistor connected to the least significant ladder network shunt resistor to a voltage, Vt, which would be equal to $V_{LSB}$, if all six transistors in the loop had the same emitter area, but which deviates therefrom by $2(kT/q)\ln 2$ due the differences in the emitter areas.

12 Claims, 4 Drawing Sheets

TERMINATION CIRCUIT FOR AN R-2R, LADDER THAT COMPENSATES FOR THE TEMPERATURE DRIFT CAUSED BY DIFFERENT CURRENT DENSITIES ALONG THE LADDER, USING ONE TYPE OF BIOPOLAR TRANSISTOR

FIELD OF THE INVENTION

This invention relates to a digital to analog converter (DAC) of the current output type that has a number of transistor current sources connected to an R-2R resistive ladder network, which establishes the current weighting. More particularly, the invention relates to a circuit which is used to terminate the R-2R ladder in a way that equalizes the temperature drift of the base-to emitter violates of the current source transistors.

DESCRIPTION OF THE PRIOR ART

The deign of a DAC, using an R-2R ladder to establish binarily related currents in successive legs of the ladder, is well understood and in general use in the industry today. A good general background discussion is contained, for example, in D. Sheingold (ed.), Analog-Digital Conversion Handbook (3d ed.), Prentice Hall, Enqlewood. Cliffs. NJ, 1986, by the Engineering staff of Analog Devices, Inc.

It is a principle of this architecture that each 2R resistor in the R-2R ladder is connected to the emitter of a bipolar transistor. The resistor transistor combination forms a current source. when the transistor is turned on, contributing a portion of the output current. In some realizations, each transistor is identical to its counterparts in the other 2R legs. However, the current in each successive 2R leg is one-half the current of the previous leg.

Consequently, the emitter currents and, therefore, the current densities are different from one transistor to the next. Hence, the base-to emitter voltages ($V_{be}$) will differ among the transistors in the ladder. As a result, both a fixed error term and a temperature-dependent error term are present in the equation for the ratio of the currents at the collectors of the current source transistors in an R-2R ladder. A simple adjusting of the 2R resistor values can reduced the fixed error, but it can not compensate for the temperature dependent differences.

U.S. Pat. No. 3,940,760 to A. Paul Brokaw, titled "Digital to Analog Converter with Improved Compensation Arrangement for offset voltage variations," teaches a way to minimize the temperature dependent error in a current summing DAC. In that patent, the 2R termination resistor of the ladder network is connected to a voltage source which develops a termination voltage that is more positive than the emitter connected to the last leg of the ladder by a voltage equal to $2(kT/q)\ln 2$, where k is Boltzmann's constant, T is absolute temperature and q is the electron change. This voltage produces, through the series resistors of the ladder, a compensation current which develops corresponding voltage components matching the base-emitter voltage differences ($\Delta V_{be}$) between successive legs (or stages), so that the voltage across each of the 2R shunt resistors of the ladder remains unaffected by changes in offset voltage due to temperature. Thus, the currents in each leg of the R-2R ladder can be maintained constant, at their changes in $V_{be}$.

While this was a substantial improvement over the prior art, the circuitry to accomplish this result requires either an amplifier with its frequency limiting capacitor(s) or the use of both NPN and PNP transistors.

Hence, it is an object of this invention to provide a circuit which will compensate for $\Delta V_{be}$ throughout the temperature range of the DAC.

It is a further object of this invention to provide a circuit which compensates for the different $V_{be}$ of each current source transistor in the R-2R ladder and that is easy to implement in a bipolar monolithic DAC.

Another object of this invention is to provide a compensation circuit which does not need an amplifier.

Yet another object of the invention is to provide a compensation circuit which is compatible with DAC's that are fabricated using only NPN bipolar technology or only PNP technology.

SUMMARY OF THE INVENTION

The present invention makes use of the theory of U.S. Pat. No. 3,940,760, and goes on to teach an improved method and apparatus for terminating an R-2R ladder in a current switching DAC.

U.S. Pat. No. 3,940,760 varied the usual arrangement of a DAC using an R-2R ladder by connecting the standard 2R terminating resistor of the ladder to an excitation voltage which is $2(kT/q)\ln 2$ closer to the supply voltage than the emitter of the current source in the last (i e , least significant) stage. The present invention greatly enhances the usefulness of the prior theory by providing excitation source circuitry that is fabricated with just one type of bipolar transistor (e.q., all NPN's or all PNP's), and does not require an amplifier with its attendant frequency compensation capacitor(s). The invention improves the accuracy of each binary current source in the R-2R ladder in a way that greatly simplifies the architecture and the fabrication of the improved R-2R DAC. The excitation source is a simple circuit requiring only five transistors. At least one of the transistors has an emitter area which is a multiple of the emitter areas of the current source transistors. The transistors in the excitation source are connected so that their base to emitter voltages are continuously connected in a voltage loop that goes from a voltage $V_{LSB}$ at the emitter of the current source transistor connected to the least significant ladder network shunt resistor to a voltage, Vt, which would be equal to $V_{LSB}$, if all six transistors in the loop had the same emitter area, but which deviates thereform by the $2(kT/q)\ln 2$ compensation voltage due the differences in the emitter areas.

The foregoing, and other objects and advantages, and the invention itself, will be more fully understood from the detailed description below, which should be read in conjunction with the accompanying drawing.

DETAILED DESCRIPTION

Figure 1:
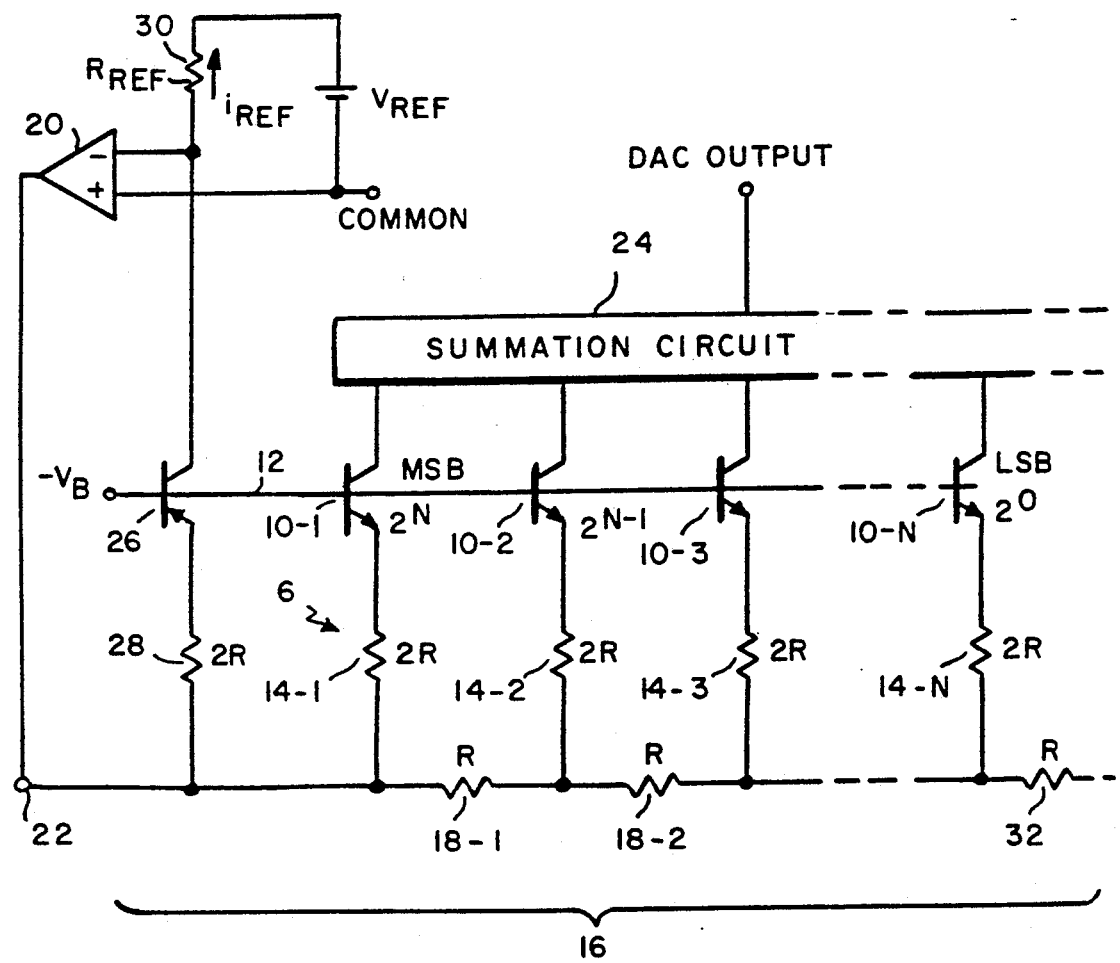
FIG. 1 is a schematic circuit diagram illustrating a portion of a conventional DAC incorporating an R-2R ladder network, according to the prior art.

FIG. 1 shows a portion of a digital to analog converter, based on a known type of DAC called a current mode or current switching. Such a converter comprises a number of identical transistors 10 1 through 10 n connected as current sources, with their bases tied to a common bias line 12, and their emitters connected to respective shunt resistors 14-1 through 14-n, all of value 2R, along an R-2R ladder 16, having series resistors (18-1, 18-2 ..., 18-n), all of value R.

The bias line (12) is held fixed at a voltage designated as $-V_b$.

The collector currents of the transistors 10-1, 10-2, 10-3, ..., 10-n are selectively summed by a summation circuit 24 to produce the desired analog output signal corresponding to an applied digital input signal, as is fully described in the general body of literature on DAC's.

The output of an operational amplifier 20 applies an excitation voltage to the input terminal 22 of the ladder 16. The ladder excitation voltage is controlled by a feedback loop, comprising a reference transistor 26, with its emitter connected through a 2R resistor 28 to the output of the operational amplifier 20. The base of this transistor is tied to the common base bias line 12, and the collector is connected to one input terminal of the amplifier. Also connected to this input terminal is a source of constant reference voltage, $V_{REF}$. The amplifier 20 continuously compares the collector current of transistor 26 with the reference current (iREF) established in resistor 30, and sets the voltage at node 22 at the lower end of resistor 28 to maintain the collector current equal to the reference current. Since the voltage at node 22 also is applied to the ladder input, the control of that voltage by the amplifier 20 serves also to stabilize the collector currents of the current source transistors 10-1, 10-2, 10-3, ..., 10-n.

The above architecture is well understood by those proficient in the art, and is in commercial use today. However, one problem presented by such a converter is that each of the identical source transistors 10-1, 10-2, 10-3, ..., 10-n operates at a different current (i.e., each successive transistor has one-half the current of the previous transistor). Therefore, no two transistors operate at the same current density; hence each has a slightly different base to-emitter voltage ($V_{be}$). Moreover, the differences between these base-to emitter voltages ($\Delta V_{be}$) are temperature dependent, so that it is not possible simply to make a compensating adjustment in the resistor network values which would accommodate the temperature varying component of the differences from stage to stage.

Figure 2:
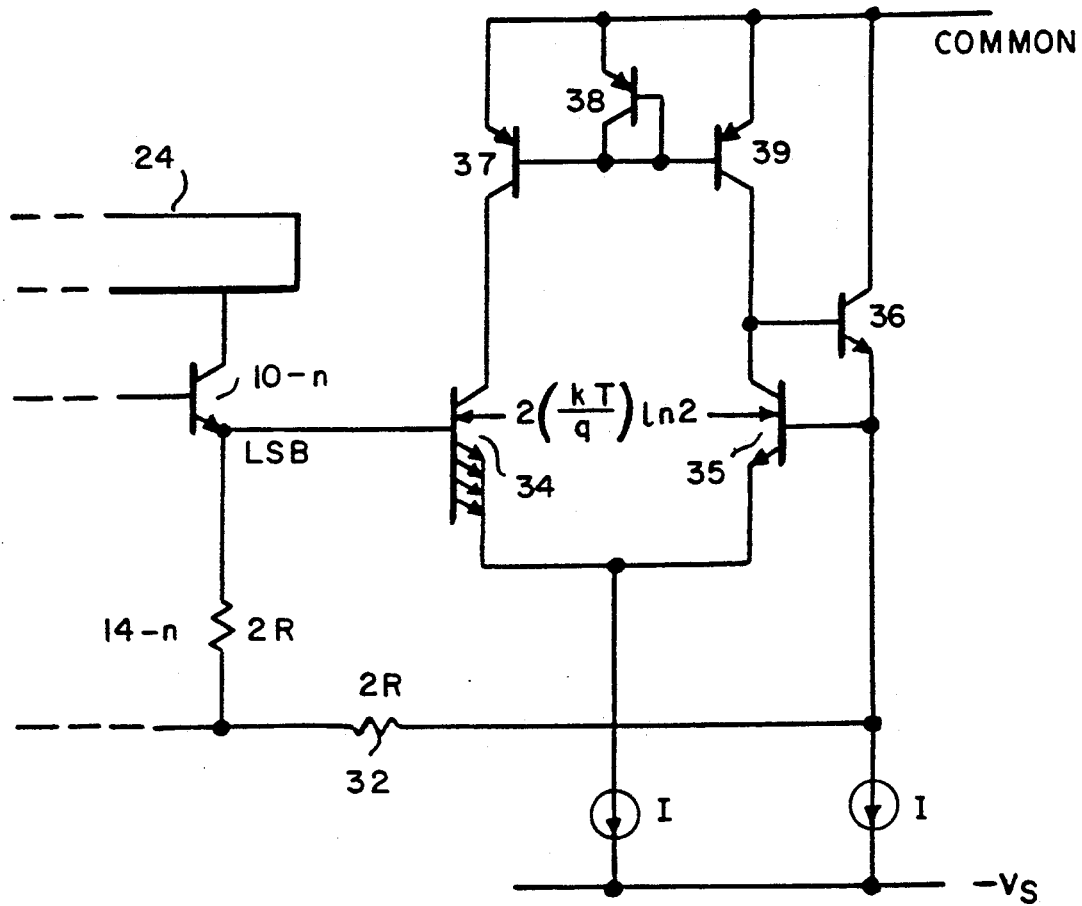
FIG. 2 shows one illustrative ladder termination arrangement according to U.S. Pat. No. 3,940,760.

FIG. 2 shows a schematic circuit diagram for developing a voltage of $2(kT/q)\ln 2$ for the 2R termination resistor 32, which supplies the current for the least significant bit's contribution, according to U.S. Pat. No. 3,940,760. This circuit consists of both NPN transistors (34, 35 and 36) and PNP transistors (37, 38 and 39). U.S. Pat. No. 3,940,760 (Brokaw) also describes other circuits for accomplishing the same compensation but typically they require either an amplifier or both NPN and PNP transistors.

Figure 3:
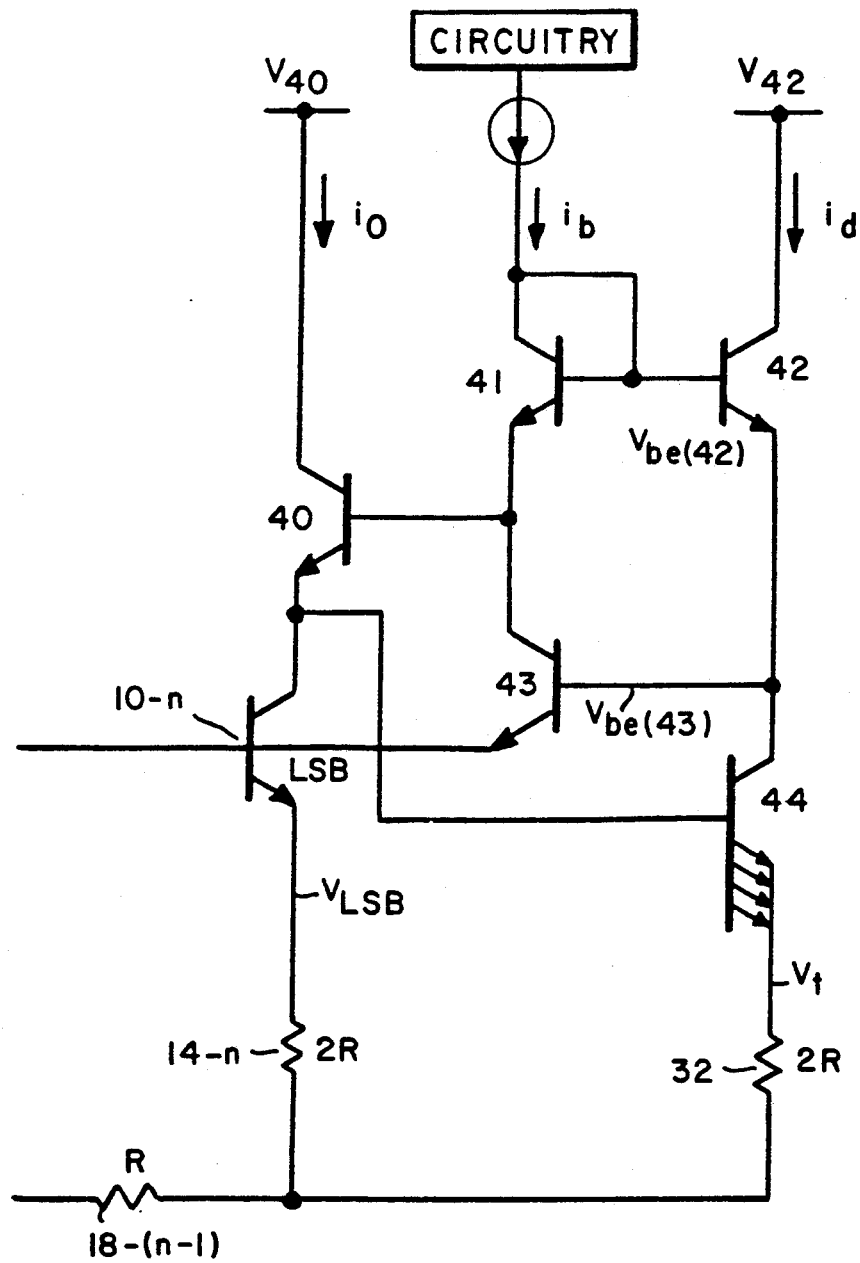
FIG. 3 shows a schematic circuit diagram of an all NPN embodiment of a ladder termination arrangement in accordance with this invention.

A simpler termination circuit, accomplishing the same temperature compensation is shown in FIG. 3. This circuit is simpler to manufacture than any previously shown circuit for achieving the compensation taught in U.S. Pat. No. 3,940,760. It does not require an amplifier, and can be fabricated in either all NPN or all PNP type transistors.

FIG. 3 shows the circuit as it connects to the LSB transistor 10 n in the R-2R ladder of the DAC. Transistors 40 through 44 terminate the ladder with a voltage which is $2kt/q \ln 2$ more positive than the emitter voltage of the LSB transistor 10-n. To see why this is so, consider the continuous path of base-to emitter voltages ($V_{be}$'s) from the emitter of transistor 10 n to the emitter of transistor 44. The voltage at the top of the resistor 32 (i.e., $V_t$) can be expressed as the sum of base to emitter voltages around the loop from $V_{LSB}$ (i.e., the voltage at the top of resistor 14-n) to $V_t$ (i.e., the voltage at the top of resistor 32). $V_{be(43)}$, and $V_{be(42)}$, ascend in voltage (i.e., are positive), whereas and $V_{be(41)}$, $V_{be(40)}$ and $V_{be(44)}$ descend (i.e., are negative). Thus $$V_{LSB} + V_{be(10-n)} + V_{be(43)} + V_{be(42)} - V_{be(41)} - V_{be(40)} - V_{be(44)} = V_t$$

Therefore, the voltage $V_t$ at the emitter of transistor 44($V_t$), minus the voltage at the emitter of the LSB transistor ($V_{LSB}$), is:

$$V_t = V_{LSB} = V_{be(10-n)} + V_{be(43)} + V_{be(42)} - V_{be(41)} - V_{be(40)} - V_{be(44)}.$$

Rearranging and grouping terms:

$$V_t - V_{LSB} = (V_{be(10-n)} - V_{be(40)}) + (V_{be(43)} - V_{be(41)}) + (V_{be(42)} - V_{be(44)})$$

Note that transistors 41 and 43 both operate at current $i_b$ if base currents are neglected. So, $V_{be41} = V_{be43}$, and the term ($V_{be(43)} - V_{be(41)}$) drops out of the expression above.

Similarly, transistors 10-n and 40 operate at the LSB current so their base emitter voltages match and the term ($V_{be(10-n)} - V_{be(40)}$) drops out as well. Finally, transistors 42 and 44 operate at the same current ($i_o$), but since transistor 44 is larger than transistor 42, it operates at a different current density. Therefore, the term involving and $V_{be(421)}$ and $V_{b(44)}$ is not zero. The difference in these base emitter voltages is given by the well known expression:

$$V_{be(42)} - V_{be(44)} = \Delta V_{be} = \Delta kT/q \Delta \ln (J_{42}/J_{44}).$$

where $J_{xx}$ is the current density in the emitter of transistor xx.

Transistor 44 is made with four times the emitter area as transistor 42 (which is why it is shown schematically with four emitters), so it operates at one-fourth the current density of transistor 42. Therefore, $$V_{be(42)} - V_{be(44)} = \Delta kT/q \Delta \ln 4$$

Substituting this value into the equation for $V_t - V_{LSB}$:

$$V_t - V_{LSB} = kt/q \ln 4 = (kT)/q \ln 2$$

Note that this result is independent of the three currents in the circuit, to a first order approximation, and independent of temperature, as well. Consequently, the ladder is terminated as described in the prior patent literature, for a variety of operating conditions.

For ease of layout, or other purposes, it may be desirable to make another of the transistors (i.e. other than transistor 44) the larger emitter device. Either transistor 40 or 41 may be made with four times the emitter area of the other transistors in the loop, instead of transistor 44, to obtain the same overall result. Alternatively, two of the three transistors 40, 41 or 44 each may have twice the emitter area, which will also achieve the same result. Or all three of those transistors could have 4/3 the area of transistor 44 and the other transistors in the loop. Other emitter area combinations can be employed, as well, so long as the total base-emitter voltage difference developed around the loop is the required 2(kT/q)ln 2, required to provide the sought after compensation. Thus, additional junctions may be introduced into the loop, as well, without departing from this teaching, so long as the loop develops the aforementioned base emitter voltage difference.

This analysis neglects errors due to base current and Early voltage. The base current of transistor 44 in the emitter of transistor 40 and the base current of transistor 40 in the emitter of transistor 41 tend to lower $V_t$. The base current of transistor 43 in transistor 42 tends to raise $V_t$. These errors have opposite sign and their cancellation may be made better by adjustment of the current $i_b$ in FIG. 3. For instance, setting $i_b = 1.5\sqrt{i_o i_d}$ ($i_e$, $i_o$ and $i_d$ are the collector currents shown in FIG. 3) will give a reasonable cancellation. Unfortunately, $i_d$ varies with temperature in a way that depends on the voltage across 2R. However, the total error will be small, using typical high beta transistors, so that it can be neglected.

A second error results from the modulation of $V_{be}$ by collector voltage. Transistors 41, 43, and 10-n operate at or near zero collector to base voltage. Transistor 44 has approximately a single base-emitter voltage reverse biasing its collector. However, the collector voltages of 40 and 42 are not constrained by the circuit, as shown. The effects of collector voltage on the two transistors have opposite results on the voltage $V_t$.

If the voltage at the collector of transistor 42 is made more positive than the collector voltage of transistor 40 by about two base to emitter violates, the effects will cancel quite well. In this case, the actual base to-collector voltage of transistor 42 is greater than that of transistor 40 by one $V_{be}$, which will compensate for the non zero collector to base voltage of 44.

Though the invention has been described in the context of a digital to analog converter, skilled artisans will appreciate that its use need not be so limited. The circuits described herein may be employed in other applications of current weighting circuits, some of which also employ R-2R ladders or similar arrangements.

Figure 4:
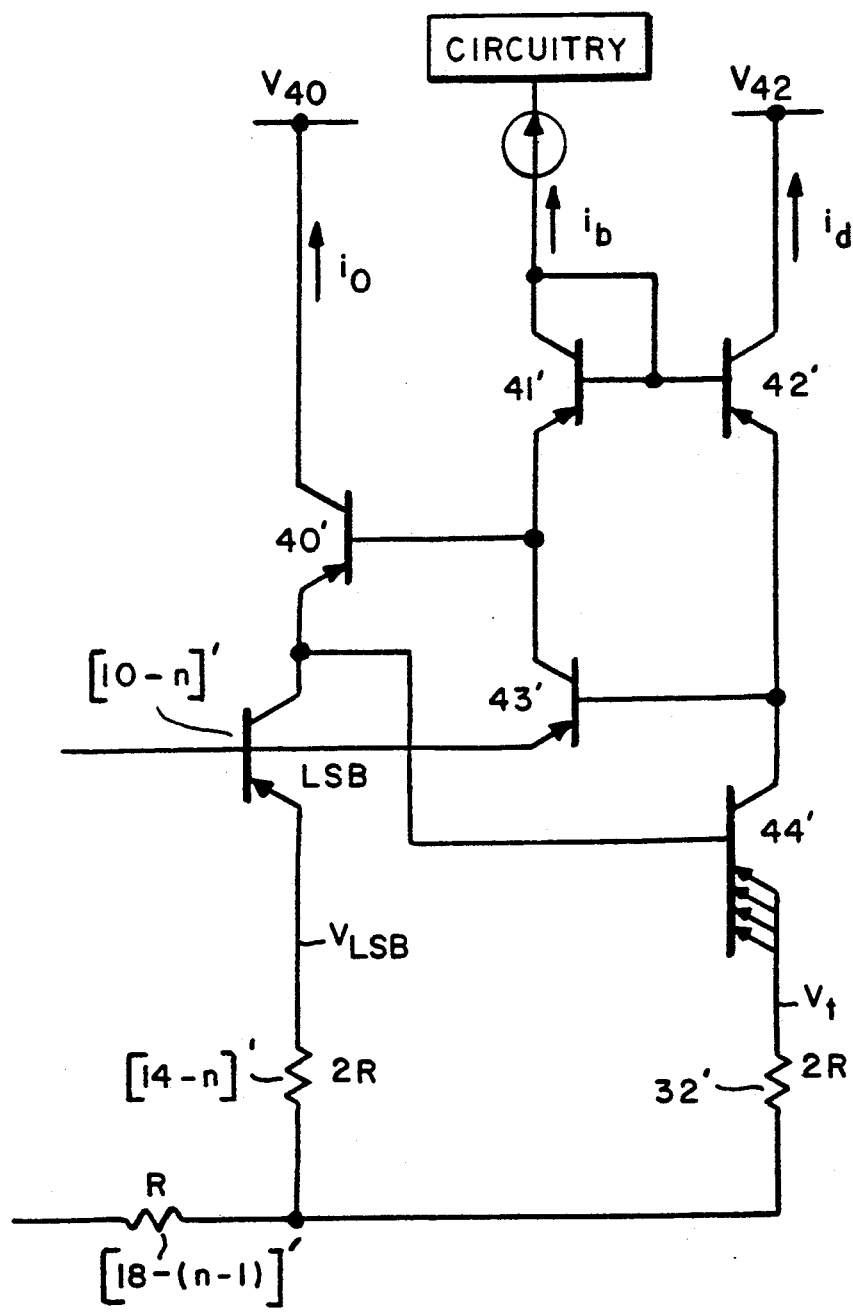
FIG. 4 shows a schematic circuit diagram of an all PNP embodiment of a ladder termination arrangement in accordance with this invention.

Having thus described an embodiment of the invention as well as the inventive concept and objectives, various alterations, improvements, modifications and other embodiments may occur to those skilled in the art. For example, though the illustrated embodiment shows the use of all NPN transistors, the current can readily be reversed to use all PNP transistors as shown in FIG. 4. Such alterations, improvements, modifications and other embodiments are intended to be suggested by the foregoing disclosure, through not expressly set forth herein. Thus, the embodiment presented herein is intended by way of example only, not for purposes of limitation. The invention is limited only as required by the appended claims, and equivalents thereto.

What is claimed is:

1. In a digital-to-analog converter adapted to be powered from a supply voltage and having a plurality of transistors serving as current sources and operating at different current densities, an R-2R resistor ladder network having shunt resistors connected to respective current-source emitters to provide for binarily weighting the currents in said emitters, and a source of excitation connected to said ladder network to develop said binarily-weighted currents through said transistors, said ladder network including at one end thereof a termination resistor of value 2R, a voltage source connected to the termination resistor to apply thereto a voltage which is 2(kT/q)ln 2 closer to the supply voltage than the voltage on the emitter of the adjacent current source transistor, the improvement comprising the voltage source being formed of a plurality of transistors all of the same bipolar type.

2. The digital-to-analog converter of claim 1 wherein the voltage source is formed of first, second, third, fourth and fifth transistors connected so that their base-to-emitter voltages are continuously connected in a voltage loop that goes from a voltage $V_{LSB}$ at the emitter of the current source transistor connected to the least significant ladder network shunt resistor to a voltage, Vt, which would be equal to $V_{LSB}$, if all six transistors in the loop had the same emitter area.

3. The digital-to-analog converter of claim 2 wherein the area of the emitter of one of the first through fifth transistors if four times the emitter area of the current source transistor connected to the least significant ladder network shunt resistor.

4. The digital-t-analog converter of claim 2 wherein the emitter areas of each of two of the first through fifth transistors each is two times the emitter area of the current source transistor connected to the least significant ladder network shunt resistor.

5. The digital-to-analog converter of claim 2 wherein the emitter areas of each of three of the first through fifth transistors if four-thirds times the emitter area of a last current source transistor connected to the least significant ladder network shunt resistor.

6. The digital-to-analog converter of claim 2 wherein the emitter of the first transistor is connected to the base of the current source transistor connected to the least significant ladder network shunt resistor, the emitter of the second transistor is connected to the base of the first transistor, the base of the third transistor is connected to the base of the second transistor, the base of the fourth transistor is connected to the emitter of the third transistor, and the base of the fifth transistor is connected to the emitter of the fourth transistor, so that the emitter of the fifth transistor is at the voltage Vt, and Vt is 2(kT/q)ln 2 closer to the supply voltage than the emitter of the current source transistor connected to the least significant ladder network shunt resistor.

7. A termination circuit for an R-2R resistor ladder network used in a current-weighting circuit having a plurality of transistors serving as current sources and operating at different current densities, the ladder including a shunt resistor associated with each current source, the shunt resistors of the ladder network being connected to respective current-source emitters to provide weighted transistor current, and a source of excitation connected to said ladder network to develop said weighted currents through said transistors, said ladder network including at one end thereof a termination resistor of value 2R, a voltage source connected to the termination resistor to apply thereto a voltage which is 2(kT/q)ln 2 closer to a supply voltage than the voltage on the emitter of the adjacent current source transistor, the improvement comprising the voltage source being formed of a plurality of transistors all of the same bipolar type.

8. The apparatus of claim 7 wherein the voltage source is formed of first, second, third, fourth and fifth transistors connected so that their base to emitter violates are continuously connected in a voltage loop that goes from a voltage $V_{LSB}$ at the emitter of the current source transistor connected to the least significant ladder network shunt resistor to a voltage, Vt, which would be equal to $V_{LSB}$, if all six transistors in the loop had the same emitter area.

9. The apparatus of claim 8 wherein the area of the emitter of one of the first through fifth transistors is four times the emitter area of the current source transistor connected to the least significant ladder network shunt resistor.

10. The apparatus of claim 8 wherein the emitter areas of each of two of the first through fifth transistors each is two times the emitter area of the current source transistor connected to the least significant ladder network shunt resistor.

11. The apparatus of claim 8 wherein the emitter areas of each of three of the first through fifth transistors is four thirds times the emitter area of the last current source transistor connected to the least significant ladder network shunt resistor.

12. The apparatus of claim 8 wherein the emitter of the first transistor is connected to the base of the current source transistor connected to the least significant ladder network shunt resistor, the emitter of the second transistor is connected to the base of the first transistor, the base of the third transistor is connected to the base of the second transistor, the base of the fourth transistor is connected to the emitter of the third transistor, and the base of the fifth transistor is connected to the emitter of the fourth transistor, so that the emitter of the fifth transistor is at the voltage Vt, and Vt is $2(kT/q)\ln 2$ closer to the supply voltage than the emitter of the current source transistor connected to the least significant ladder network shunt resistor.

* * * * *

UNITED STATES PATENT AND TRADEMARK OFFICE
CERTIFICATE OF CORRECTION

PATENT NO. : 5,119,094
DATED : June 2, 1992
INVENTOR(S) : A. Paul Brokaw

It is certified that error appears in the above-indentified patent and that said Letters Patent is hereby corrected as shown below:

On the title page, item [54], change "BIOPOLAR" to --BIPOLAR--;

Col. 1, line 5, change "BIOPOLAR" to --BIPOLAR--;

Col. 1, line 14, change "violates" to --voltages--; and

Col. 1, line 16, change "deign" to --dsign--.

Signed and Sealed this

Twelfth Day of October, 1993

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,119,094
DATED : June 2, 1992
INVENTOR(S) : A. Paul Brokaw

It is certified that error appears in the above-indentified patent and that said Letters Patent is hereby corrected as shown below:

On the title page, item [54], change "BIOPOLAR" to --BIPOLAR--;

Col. 1, line 5, change "BIOPOLAR" to --BIPOLAR--;

Col. 1, line 14, change "violates" to --voltages--; and

Col. 1, line 16, change "deign" to --design--

This Certificate supersedes Certificate of Correction issued Oct. 12, 1993.

Signed and Sealed this

Twenty-second Day of March, 1994

Attest:

BRUCE LEHMAN

*Attesting Officer*  *Commissioner of Patents and Trademarks*